United States Patent [19]

Anderson et al.

[11] Patent Number: 4,788,270

[45] Date of Patent: Nov. 29, 1988

[54] PROCESS FOR PREPARING A URETHANE COATING COMPRISING FREEZING A PREMIX OF AN ISOCYANATE AND A POLYOL IN A SOLVENT

[75] Inventors: Edward A. Anderson, Yorba Linda; Ivars Miculs, Studio City; Koji Tomikawa, Los Angeles, all of Calif.

[73] Assignee: Hughes Aircraft Company, Los Angeles, Calif.

[21] Appl. No.: 58,476

[22] Filed: Jun. 5, 1987

[51] Int. Cl.$^4$ .................. C08G 18/32; C08G 18/34; C08F 6/00; C08K 5/06
[52] U.S. Cl. ........................... 528/77; 528/80; 528/481; 524/760; 524/839
[58] Field of Search ............... 528/77, 80, 481; 524/839, 760

[56] References Cited

U.S. PATENT DOCUMENTS

| | | |
|---|---|---|
| 3,939,105 | 2/1976 | Jones, Jr. et al. .................. 528/77 |
| 3,940,542 | 2/1976 | Knopf et al. ....................... 528/77 |
| 4,311,815 | 1/1982 | Heine ................................. 528/76 |
| 4,434,284 | 2/1984 | Rukavina et al. ................. 528/77 |
| 4,511,626 | 4/1985 | Schumacher ...................... 528/52 |
| 4,576,855 | 3/1986 | Okina et al. ..................... 428/215 |
| 4,611,043 | 9/1986 | Bruson et al. ..................... 528/49 |

*Primary Examiner*—Harold D. Anderson
*Assistant Examiner*—Dennis R. Daley
*Attorney, Agent, or Firm*—S. M. Mitchell; M. J. Meltzer; A. W. Karambelas

[57] ABSTRACT

A frozen urethane premix coating material is prepared by mixing together an isocyanate, a hydroxy terminated aliphatic polyol, and an organic solvent in an amount of at least 75 percent by weight of the total weight of the premix, and then freezing the mixture. The storage life of the mixture is several months, after which it is thawed and used as a coating material. In one form, the premix includes 4,4'-diphenyl methane diisocyanate as the isocyanate and a mixture of toluene and methyl ethyl ketone as the solvent.

12 Claims, No Drawings

PROCESS FOR PREPARING A URETHANE COATING COMPRISING FREEZING A PREMIX OF AN ISOCYANATE AND A POLYOL IN A SOLVENT

BACKGROUND OF THE INVENTION

This invention relates to coating materials, and in particular to urethane coating materials such as used as conformal coatings in packaging electronic components.

Polyurethanes are one of the commercially most important classes of synthetic coating materials. They are readily formulated to have excellent physical properties, including high toughness, a controllable range of flexibility, high abrasion resistance, and good moisture and chemical resistance. Other properties such as adhesion and optical transparency can be produced in some types of polyurethanes. The physical properties can be varied over ranges by controlling composition and the reaction conditions of formation.

Polyurethanes also have attractive electrical properties that, combined with the physical properties, make them candidates for use in electrical component packaging applications. Some polyurethanes can be made to be highly stable electrical insulators that do not adversely affect high frequency signals, that do not outgas or otherwise have damaging reaction products, and which adhere to substrates such as circuit boards or chips. Such polyurethanes are prepared in a liquid or flowable state, brushed, sprayed, or poured over the electrical component to be protected, and permitted to harden as a coating over the component. These coatings are called conformal coatings, as they conform to the shape of the component and protect it from external damage.

Urethanes are formed by reacting an isocyanate with a source of active hydroxy groups, to produce a urethane linkage. The use of polyfunctional reactants, those having two or more isocyanate groups and two or more active hydroxy groups, results in the formation of higher molecular weight polymers called polyurethanes. Polyurethanes are preferred for coating applications, and the polyurethane reaction can be accomplished in a number of ways.

In one approach to the polyurethane formation reaction as used to prepare conformal coatings for use in electronics packaging, one component is a prepolymer or adduct having free isocyanate groups, and the other is a resin having reactive hydrogen atoms, such as hydroxy-terminated polyols. These reactants are mixed together in a flowable composition, coated over the component, and allowed to harden. The result is a hard, durable protective coating over the component, which does not interfere with its operation.

The reactants of the polyurethane reaction are usually mixed together prior to the time that they are needed, and stored at low temperature to inhibit the urethane/polymerization reaction. After thawing, the user typically has about $\frac{1}{2}$ hour to dilute the mixture with a solvent to render it more flowable, and then to apply the thawed and diluted mixture before the reaction proceeds too far for application to be possible. This procedure is followed for two reasons. First, larger batches can be mixed economically and with proper mixing controls, and then divided and packaged and frozen as individual packets to be thawed as needed. Second, the mixing and freezing is typically accomplished at a central location that has adequate environmental safeguards for preparing the mixtures, which often contain toxic ingredients.

While this approach of preparing ingredient mixtures at a central location, freezing packets of the mixture, and then later thawing and using the packets often works well, there is one significant problem. Even when frozen at $-40°$ C., the mixture deteriorates during storage, so that the shelf life of frozen packets before they must be used is typically only about 1 month. If the packet is not used within about 1 month of being frozen, its quality deteriorates so that it cannot be used and must be discarded. In large scale electronics packaging operations, and those involving critical applications such as spacecraft electronics, there must be careful attention to control and use of the inventory of frozen packets. Where the need for use, and the supply, of conformal coatings are intermittent or periodic, packets of frozen reactants are often discarded after expiration of their specified shelf life. The electronics manufacturer simply cannot risk using deteriorarted conformal coating mixture, because of the possibility of the coating causing failure of the expensive electronics components. Consequently, many thousands of dollars of waste may result each year due to the discarding of packets of frozen reactants that have exceeded their shelf lives.

There is therefore an immediate need for some approach to reducing waste resulting from deterioration of frozen polyurethane coating materials. It is believed that a solution to this problem may also be useful in other fields which use urethanes and polyurethanes as coatings and for other applications. The present invention fulfills this need, and further provides related advantages.

SUMMARY OF THE INVENTION

The present invention resides in a method of increasing the shelf life of frozen reactant mixtures than, when thawed and reacted, produce urethane or polyurethane materials. The shelf life is increased to at least several months. The increase in shelf life is accomplished without any significant increase in cost, by changing the processing procedures. The improved processing can save thousands of dollars per year in many electronics packaging operations.

In accordance with the invention, a process for preparing a urethane coating material comprises the steps of mixing together an isocyanate, a hydroxy terminated aliphatic polyol, and an organic solvent to form a premix, the solvent being present in an amount of at least about 75 weight percent of the total weight of the mixture, and freezing the premix at a temperature of less than about 0° C.

In prior procedures, either a very small amount of solvent was added to the mixture of reactants prior to freezing, or no solvent was added at all. The majority of the solvent was added after the premix was thawed and immediately prior to use. The solvent acted as a thinner to improve the flow characteristics of the thawed mixture so that it could be readily applied to the surface to be coated.

It has now been found that adding the solvent to the mixture of reactants prior to freezing results in substantially extended shelf life. To achieve this result, an amount of solvent of at least about 75 percent by weight of the total mixture of solvent and other reactants must be added prior to freezing. The solvent itself is not highly expensive, and would normally be added after thawing in an amount sufficient to promote flowability. The processing improvement therefore does not add significantly to the cost of the coating material as applied to the surface to be coated. Additionally, it is not necessary for the electronics manufacturer to be concerned with the preparation of formulations, since the solvent is added by the premix manufacturer at his central location. A small amount of additional solvent can be added after thawing if necessary to adjust the flow properties, but in normal practice the proper amount of solvent is added prior to freezing so that the frozen premix can be thawed and immediately applied to a surface.

No limitation is known as to the isocyanate and polyol used in preparing the premix, as long as they are otherwise acceptable in the urethane or polyurethane reaction. One operable combination is 4,4'-diphenyl methane diisocyanate and the propylene ether triol or polycaprolactone polyol. The solvent normally contains toluene, and may be a mixture such as toluene and Cellosolve acetate (ethylene glycol monoethyl ehther acetate). The premix is typically frozen at a temperature of about −40° C. and stored until necessary. Testing has shown that the shelf life is increased from a maximum of 1 month, for the prior approach, to at least several months for the present approach, and the actual shelf life may be even longer. When the frozen premix is to be used, it is thawed and then applied to a surface as a layer and permitted to harden. Although the exact basis for the increased shelf life is not known with certainty, it is believed that the frozen premix material is unique in having an extended shelf life.

Various other materials can be present in the premix prior to freezing. For example, the isocyanate and polyol are typically provided with some small amount of intermixed solvent to aid in the preparation of the mixture. Accelerators or indicator compounds can also be added in the necessary small amounts, as needed, without adversely affecting the shelf life of the frozen premix.

In a particularly preferred embodiment, a process for preparing a urethane coating material comprises the steps of mixing together three components to form a premix, the first component consisting essentially of at least 90 percent by weight of 4,4'-diphenyl methane diisocyanate and higher molecular weight polymers, and no more than 10 percent by weight of toluene, the second component consisting essentially of at least 80 percent by weight of hydroxy terminated aliphatic polyols, no more than 10 percent by weight of toluene, and no more than 10 percent by weight of methyl ethyl ketone, the third component consisting essentially of about 50 percent by weight of toluene and 50 percent by weight of Cellosolve acetate, the first component being present in an amount of about 18 parts by weight, the second component being present in an amount of about 100 parts by weight, and the third component being present in an amount of about 354 parts by weight; and freezing the premix at a temperature of about −40° C. This premix has a proven frozen shelf life of several months. As needed within its self life, packets of the premix are thawed and applied to a surface as a layer, and permitted to harden. The premix is unique in having this extended shelf life.

It will be appreciated that the process of the present invention provides an advance in the art of urethane and polyurethane coating materials. the frozen shelf life of premixes used to produce these coatings is increased severalfold, reducing the amount that must be discarded and also easing the previously required stringent inventory and purchasing controls. With the invention, the preparation of the coating material is accomplished at the central preparation plant having specialized environmental controls and preparation facilities, increasing the convenience for the end user. There is essentially no increase in cost, since the solvent that is added prior to freezing in the present invention would be added after thawing according to prior practice. Other features and advantages of the present invention will be apparent from the following more detailed description, which illustrates, by way of example, the principles of the invention.

DETAILED DESCRIPTION OF THE PREFERRED EMBODIMENT

In a preferred embodiment, the premix is prepared by mixing together three separate components, and then the premix is frozen. The first component is the isocyanate, preferably 4-4'-diphenyl methane diisocyanate. The first component is prepared to include at least about 90 percent by weight of 4-4'-diphenyl methane diisocyanate and minor amounts of higher molecular weight polymers that may be present in the diisocyanate as a result of its preparation. Up to about 10 percent of a solvent, toluene, is present to aid in working the first component.

The second component is prepared as a mixture of at least 80 percent by weight of a hydroxy terminated aliphatic polyol such as a polypropylene ether triol or polycaprolactone polyol, no more than about 10 percent by weight of toluene solvent, and no more than about 10 percent by weight of methyl ethyl ketone. The toluene solvent aids in mixing the second component, and the methyl ethyl ketone acts as a diluent so that the mixture spreads properly. In a most preferred embodiment, a fluorescent dye is added in an amount of less than 1 percent by weight to the second component, so that the final hardened polyurethane coating can be analyzed by ultraviolet light to determine its coverage.

The third component is the solvent added in a large fraction to increase the shelf life of the premix. The third component is preferably a mixture of equal parts by weight of toluene and Cellosolve acetate (a commercial name for ethylene glycol monoethyl ether acetate). Other organic solvents can be used, such as Xylene or ethoxy ethyl acetate.

The three components are mixed together in amounts that are appropriate to achieving the final hardened polyurethane coating, and to attaining the increased shelf life. A ratio of 18 parts weight of the first component, 100 parts by weight of the second component, and 354 parts by weight of the third component has been found satisfactory.

The three components are mixed together thoroughly, and divided into portions appropriate for the subsequent use. The portions are placed into containers such as packets or syringes, which are then immediately quick frozen to minimize any reaction between the first and second components. A convenient freezing temperature has been found to be −40° C., which can be maintained in a commercial freezer and with dry ice. The frozen premix can be stored at the place of use and the place of mixing in a freezer, and can be shipped in dry ice.

It is in this form that the premix has an extended shelf life. The shelf life can be assessed by evaluating the ability of the frozen and thawed premix to be extruded from a container. If the ability to extrude the thawed premix is reduced to an unacceptably low level, then it is concluded that the usable shelf life has been exceeded.

To test the shelf life of the premix, batches were prepared with and without the addition of solvent. Premix A, not in accordance with the invention, was prepared as a mixture of 18 parts of the first component and 100 parts of the second component. Premix B, in accordance with the invention, was prepared as a mixture of 18 parts of the first component, 100 parts of the second component, and 354 parts of the third component. A number of separate packages of Premix A and Premix B material were prepared and frozen at −40° C. for periods of time of from 1 to 7 weeks, corresponding to various shelf storages.

After each storage period, three packets of each premix were removed from the freezer and thawed. Each packet of premix was immediately loaded into a one cubic centimeter syringe having a #21 needle. Thawed premix was forced out of the syringe under 40 pounds per square inch of pneumatic pressure. The ejected material was collected for 30 seconds and weighed. The results of the extrusion tests are presented in the following table, where the second and third columns are extrusion rate in grams per minute. Each entry is the average of the three extrusion tests for each combination of premix and storage time.

| Time (weeks) | Extrusion Rate (gms/min) | |
| --- | --- | --- |
| | Premix A | Premix B |
| 0 (as frozen) | 1.199 | 1.436 |
| 1 | 0.825 | 1.749 |
| 2 | 0.498 | 2.547 |
| 3 | 0.215 | 2.973 |
| 4 | 0.183 | 3.649 |
| 5 | 0.085 | 3.256 |
| 6 | 0.066 | 2.150 |
| 7 | 0.0 | 1.458 |

After 7 weeks of storage, the Premix A material, without a solvent addition prior to freezing, did not flow and was useless. The useful shelf life of the Premix A material was judged to be about 4 weeks, after which the Premix A had an extrusion rate less than 10% of its initial rate. The Premix B material, on the other hand, exhibited slightly better flow than it did initially. Extrapolations of these results suggest that the Premix B material has a useful shelf life of at least 3 to 6 months, and possibly longer. The Premix B material made in accordance with the invention can also have a hardening accelerator added, and retains its extended shelf life.

After the prior premix, having no added solvent, is thawed, solvent is added to improve its flowability and workability. The premix is applied to the surface to be protected, and allowed to harden in air in about 60 minutes. This same procedure is followed for the premix of the present invention, except that no solvent is added, inasmuch as solvent had been added prior to freezing. Elimination of the need to add solvent after thawing is a significant convenience for the end user manufacturing personnel, who avoid the need for a special mixing facility and care. The two types of premix yield similar performance in application, hardening, and encapsulation protection performance. That is, adding the solvent prior to freezing does not adversely affect the performance of the thawed premix and resulting polyurethane.

Thus, the processing modification of the present invention, wherein a large weight fraction of solvent is added to the premix prior to freezing, provides significant advantages in shelf life and convenience. While solvent was previously added to frozen premixes after thawing, there was no reason to expect that adding the solvent prior to freezing would increase the shelf life of the premix.

Although a particular embodiment of the invention has been described in detail for purposes of illustration, various modifications may be made without departing from the spirit and scope of the invention. Accordingly, the invention is not to be limited except as by the appended claims.

What is claimed is:

1. A process for preparing a urethane coating material, comprising the steps of:
   mixing together an isocyanate, a hydroxy terminated aliphatic polyol, and an organic solvent to form a premix, the premix having a freezing point of less than about 0° C., the solvent being present in an amount of at least about 75 weight percent of the total weight of the mixture; and
   freezing the premix.

2. The process of claim 1, wherein the isocyanate is a diisocyanate.

3. The process of claim 1, wherein the isocyanate is 4,4'-diphenyl methane diisocyanate.

4. The process of claim 1, wherein the hydroxy terminated aliphatic polyol is selected from the group consisting of a polypropylene ether triol and polycaprolactone polyol.

5. The process of claim 1, wherein the solvent includes toluene.

6. The process of claim 1, wherein the solvent is a mixture of toluene and ethylene glycol monoethyl ether acetate.

7. A process for preparing a urethane coating material, comprising the steps of:
   mixing together an isocyanate, a hydroxy terminated aliphatic polyol, and an organic solvent to form a premix, the solvent being present in an amount of at least about 75 weight percent of the total weight of the mixture; and
   freezing the premix at a temperature of about −40° C.

8. The process of claim 1, wherein the process includes, after said step of freezing, the further step of thawing the frozen premix.

9. The process of claim 8, wherein the process includes, after said step of thawing, the further step of applying the thawed premix to a surface as a layer and permitting the layer to harden.

10. A process for preparing a urethane coating material, comprising the steps of:
    mixing together three components to form a premix,
    the first component consisting essentially of at least 90 percent by weight of 4,4'-diphenylmethane diisocyanate and higher molecular weight polymers and no more than 10 percent by weight of toluene,
    the second component consisting essentially of at least 80 percent by weight of hydroxy terminated aliphatic polyols, no more than 10 percent by weight toluene, and no more than 10 percent by weight of methylethyl ketone,
    the third component consisting essentially of about 50 percent by weight of toluene and 50 percent by weight of ethylene glycol monoethyl ether acetate, the first component being present in an amount of about 18 parts by weight, the second component being present in an amount of about 100 parts by weight, and the third component being present in an amount of at least about 354 parts by weight; and freezing the premix at a temperature of about −40° C.

11. The process of claim 10, wherein the process includes, after said step of freezing, the further step of thawing the frozen premix.

12. The process of claim 11, wherein the process includes, after said step of thawing, the further step of applying the thawed premix to a surface as a layer and permitting the layer to harden.

* * * * *